United States Patent
Sekar et al.

(10) Patent No.: US 7,577,031 B2
(45) Date of Patent: Aug. 18, 2009

(54) NON-VOLATILE MEMORY WITH COMPENSATION FOR VARIATIONS ALONG A WORD LINE

(75) Inventors: Deepak Chandra Sekar, Atlanta, GA (US); Man Lung Mui, Santa Clara, CA (US); Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/693,616

(22) Filed: Mar. 29, 2007

(65) Prior Publication Data

US 2008/0239824 A1    Oct. 2, 2008

(51) Int. Cl.
 G11C 11/34    (2006.01)
(52) U.S. Cl. .............................. 365/185.09; 365/185.24
(58) Field of Classification Search ............ 365/185.09, 365/185.24
See application file for complete search history.

(56) References Cited

U.S. PATENT DOCUMENTS

| | | |
|---|---|---|
| 4,734,886 A | 3/1988 | Blankenship et al. |
| 5,070,032 A | 12/1991 | Yuan et al. |
| 5,095,344 A | 3/1992 | Harari et al. |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,812,440 A | 9/1998 | Suminaga et al. |
| 5,903,495 A | 5/1999 | Takeuchi et al. |
| 6,011,725 A | 1/2000 | Eitan |

(Continued)

FOREIGN PATENT DOCUMENTS

JP    06 150670 A    5/1994

OTHER PUBLICATIONS

Eitan et al., "NROM: A Novel Localized Trapping 2-Bit Nonvolatile Memory Cell," IEEE Electron Device Letters, vol. 21, No. 11, Nov. 2000, pp. 543-545.
Chan, "Methods for Improved Program-Verify Operations in Non-Volatile Memories," U.S. Appl. No. 11/323,596, filed Dec. 29, 2005, 66 pages.

(Continued)

*Primary Examiner*—Michael T Tran
(74) *Attorney, Agent, or Firm*—Davis Wright Tremaine LLP

(57) ABSTRACT

Variation in programming efficacy due to variation in time constants along a word line that spans across a memory plane is compensated by adjusting the bit line voltages across the plane to modify the programming rates. In this way, the variation in programming efficacy is substantially reduced during programming of a group of memory cells coupled to the word line. This will allow uniform optimization of programming across the group of memory cells and reduce the number of programming pulses required to program the group of memory cells, thereby improving performance. In one embodiment, during programming, the bit lines in a first half of the memory plane closer to a source of word line voltage is set to a first voltage and the bit lines in a second half of the memory plane further from the source of word line voltage is set to a second voltage.

7 Claims, 12 Drawing Sheets

Programming with Bit-line Compensation along a Word Line

U.S. PATENT DOCUMENTS

| | | | |
|---|---|---|---|
| 6,046,935 | A | 4/2000 | Takeuchi et al. |
| 6,222,762 | B1 | 4/2001 | Guterman et al. |
| 6,337,807 | B2 | 1/2002 | Futatsuyama et al. |
| 7,254,064 | B2 * | 8/2007 | Kim et al. ............... 365/189.05 |
| 2002/0006068 | A1 | 1/2002 | Pochmuller |
| 2002/0021543 | A1 | 2/2002 | Gogl et al. |
| 2005/0232021 | A1 * | 10/2005 | Lisart .................... 365/185.24 |
| 2006/0203587 | A1 | 9/2006 | Li et al. |
| 2006/0221693 | A1 | 10/2006 | Cernea et al. |
| 2007/0223285 | A1 * | 9/2007 | Wooldridge ........... 365/185.29 |
| 2007/0253256 | A1 * | 11/2007 | Aritome ................ 365/185.24 |
| 2008/0056006 | A1 * | 3/2008 | Jung et al. ............. 365/185.22 |

OTHER PUBLICATIONS

EPO/ISA, "Notification of Transmittal of the International Search Report and the Written Opinion of the International Searching Authority, or the Declaration," corresponding International Patent Application No. PCT/US2008/056975, mailed on Jul. 8, 2008, 13 pages.

USPTO, "Notice of Allowance and Fee(s) Due," corresponding U.S. Appl. No. 11/693,601 on Aug. 8, 2008, 18 pages.

* cited by examiner

Tyical Progam/Verify voltages on a Word Line
during normal use of the memory

Programming with Bit-line Compensation along a Word Line

NON-VOLATILE MEMORY WITH COMPENSATION FOR VARIATIONS ALONG A WORD LINE

CROSS REFERENCE TO RELATED APPLICATION

This application is also related to the following U.S. patent application: U.S. application Ser. No. 11/693,601, entitled "Method for Compensating Variations along a Word Line an a Non-Volatile Memory" by Sekar et al, filed concurrently herewith, on Mar. 29, 2007, U.S. Patent Application Publication No. 2008/0239813 A1.

FIELD OF THE INVENTION

This invention relates generally to non-volatile semiconductor memory such as electrically erasable programmable read-only memory (EEPROM) and flash EEPROM, and specifically to memory operations in which variation along a word line is compensated for by appropriate bit line voltages.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain; and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In typical memory architecture, a row of memory elements shares a common word line. However, with further shrinkage of the memory elements and higher integration of the memory chip, wires become thinner and more resistive. This causes wire RC delay such as that found in a word line to become increasing significant. For example, this has been seen to cause as much as 0.4V difference in programmed threshold (VT) values between memory elements close to the row decoder and memory elements far away from the row decoder. During programming of a page, additional programming pulses may be required to address the differences and thereby degrading performance.

Therefore there is a general need for high capacity and high performance non-volatile memory. In particular, there is a need to have a high capacity nonvolatile memory able to conduct memory operations in large blocks with high performance.

SUMMARY OF INVENTION

According to a general aspect of the present invention, variation in programming efficacy due to variation in time constants along a word line that spans across a memory plane is compensated by adjusting the bit line voltages across the plane to modify the programming rates. In this way, the variation in programming efficacy is substantially reduced during programming of a group of memory cells coupled to the word line.

This will reduce the number of programming pulses required to program the group of memory cells, thereby improving performance.

In one embodiment, during programming, the bit lines in a first half of the memory plane closer to a source of word line voltage is set to a first voltage and the bit lines in a second half of the memory plane further from the source of word line voltage is set to a second voltage. In particular, the first voltage is greater than the second voltage in such away that variation in programming efficacy between the two halves is substantially minimized.

According to another embodiment of the present invention, the different bit line voltages are driven by respective bit line voltage shifters. For example, the bit lines in the first half of the memory plane are coupled to be driven by a first voltage shifter to the first voltage and the bit lines in the second half of the memory plane are coupled to be driven by a second voltage shifter to the second voltage.

Generally, more than two bit line voltages based on distance from the word line voltage source, such as a row decoder, can be implemented.

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

FIG. 1 to FIG. 5 illustrate example memory systems in which the various aspects of the present invention may be implemented.

FIG. 6 to FIG. 12 illustrate embodiments of the word line compensation techniques and device of the present invention.

Figure 1:
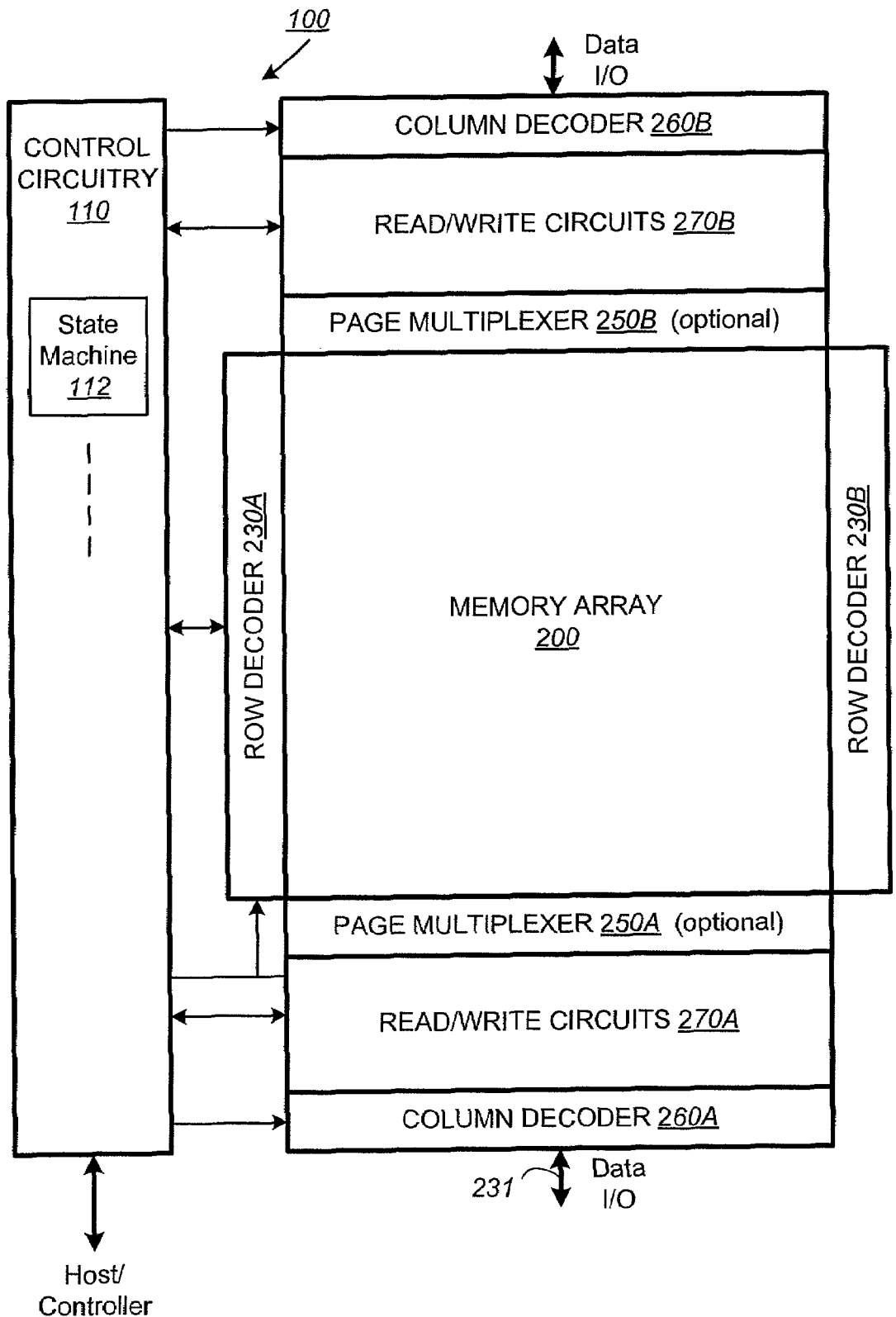
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
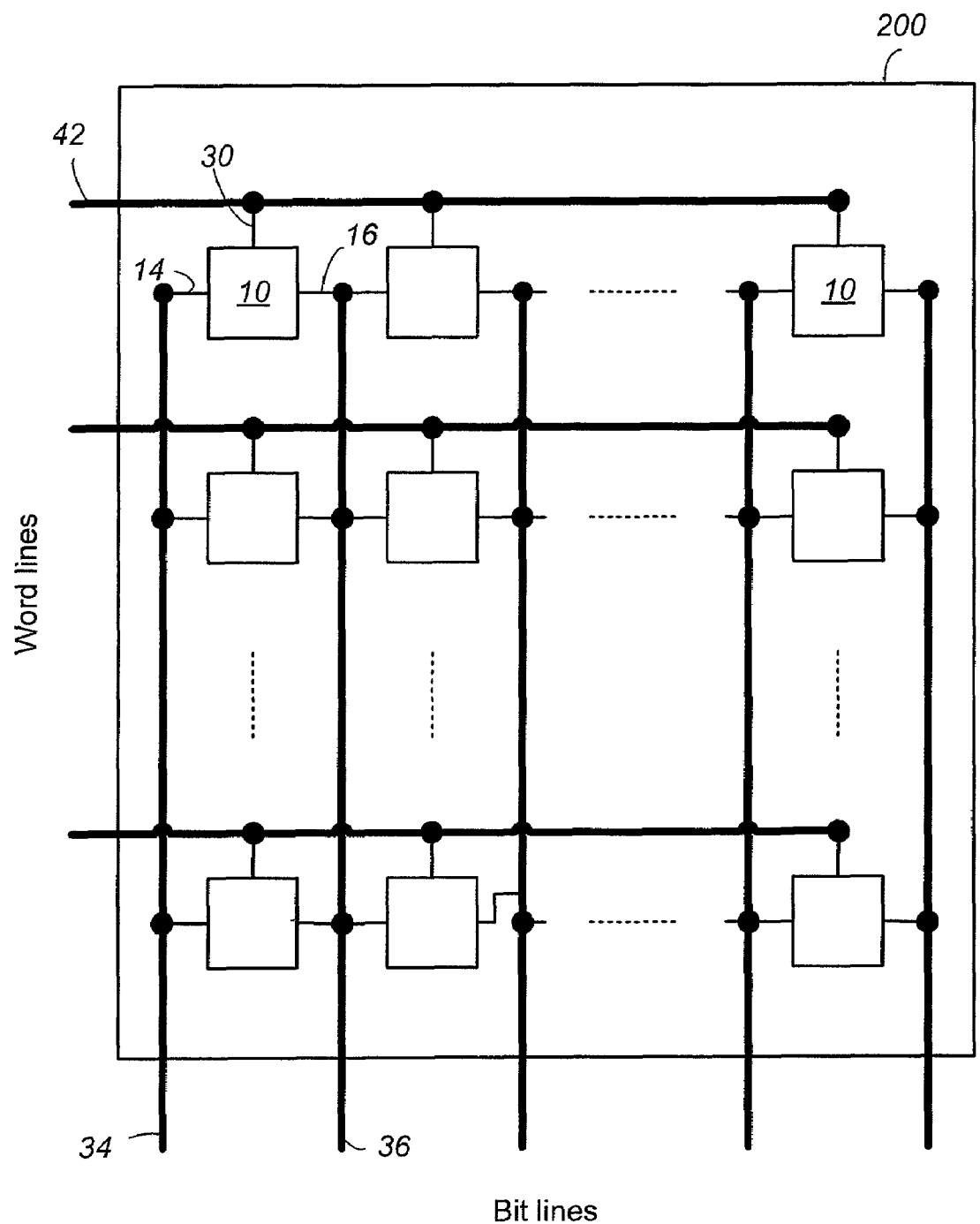
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
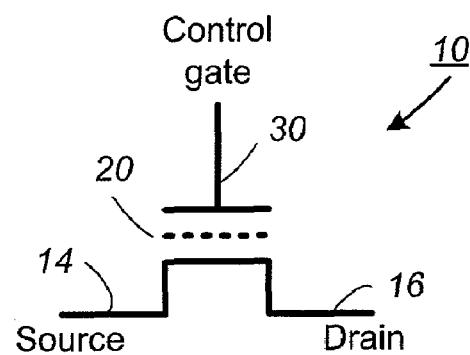
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
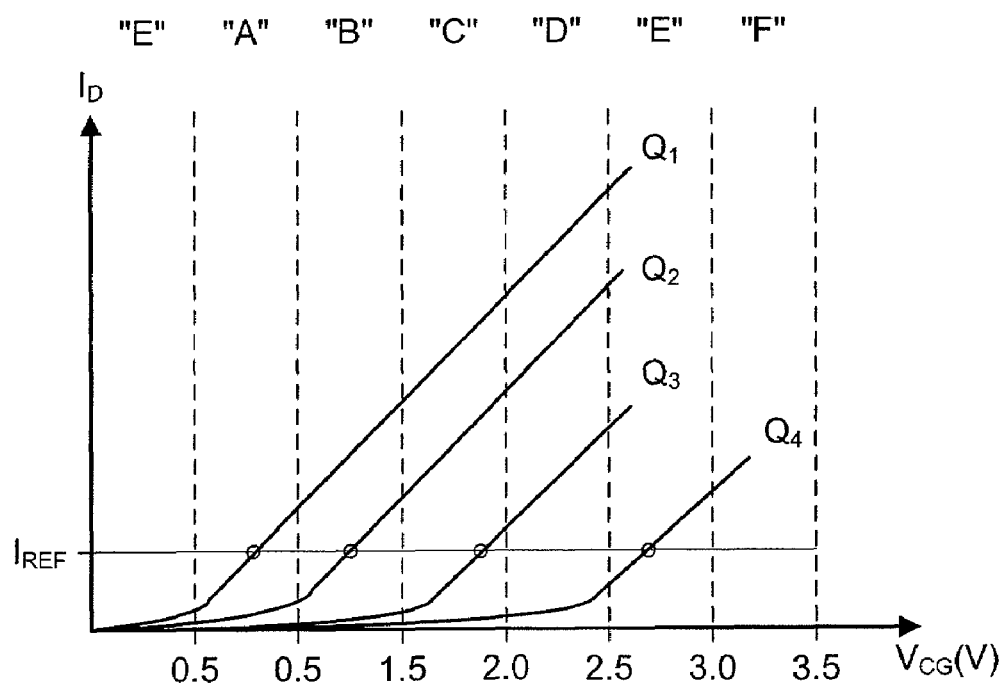
FIG. 3 illustrates the relation between the source-drain current ID and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "Gr", "A", "B", "C", "D", "E", "F", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "A" since its curve intersects with $I_{REF}$ in the region of the threshold window demarcated by VCG=0.5V and 1.0V. Similarly, Q4 is in a memory state "E".

As can be seen from the description above, the more states a memory cell is made to store, the more finely divided is its threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
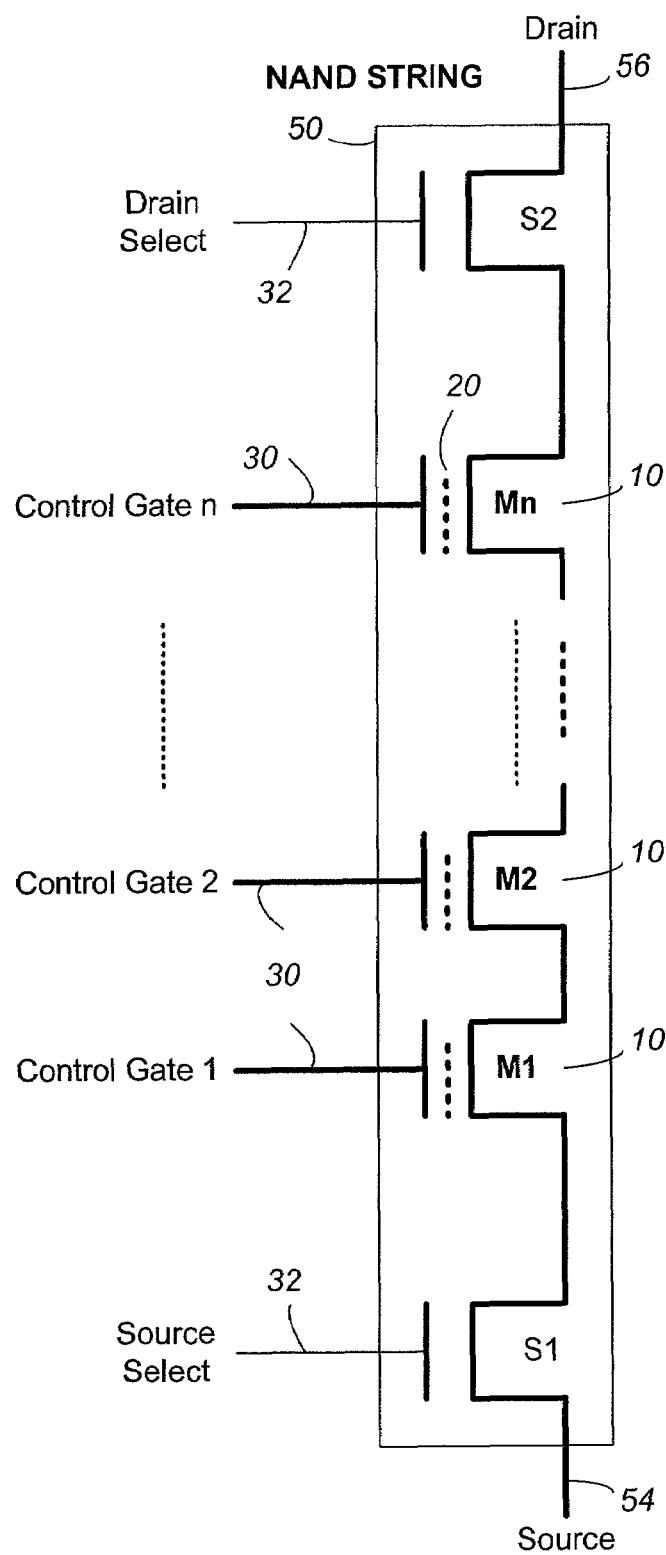
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor provides control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
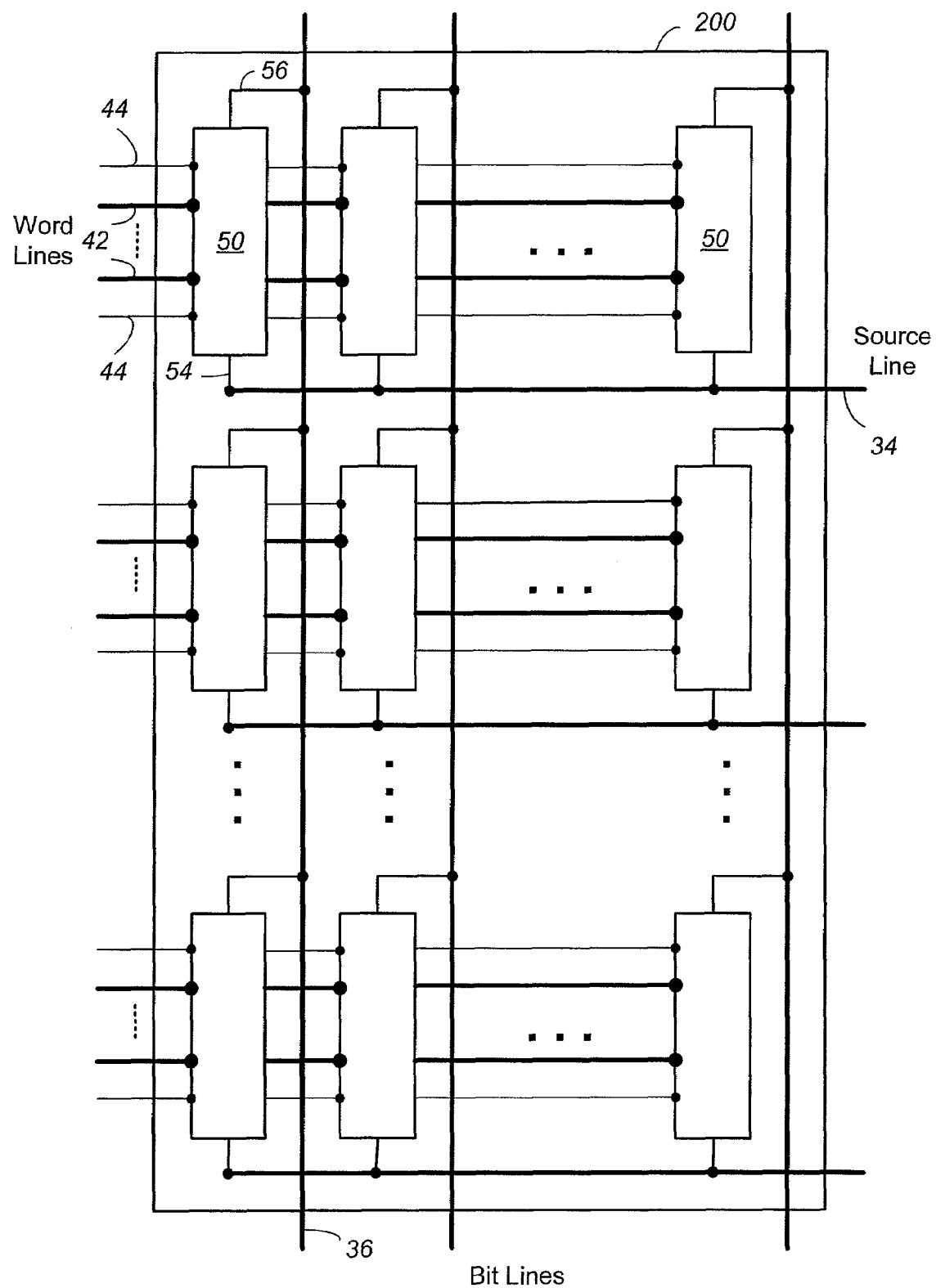
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Compensation for Variation Along a Word Line During Memory Operation

In typical memory architecture, a row of memory elements shares a common word line. For example, a row of memory cells each has its control gate coupled to the word line. However, with further shrinkage of the memory elements and higher integration of the memory chip, wires become thinner and more resistive. This causes wire RC delay such as that found in a word line to become increasing significant. For example, this has been seen to cause as much as 0.4V difference in programmed threshold (VT) values between memory elements close to the row decoder and memory elements far away from the row decoder. During programming of a page, additional programming pulses may be required to address the differences and thereby degrading performance.

One possible solution is to improve the process of manufacturing the memory chip by using less resistive materials for the word lines. However, process changes are difficult to implement and, even if feasible, will eventually reach a limit.

According to one aspect of the invention, variation in programming efficacy due to variation in time constants along a word line that spans across a memory plane is compensated by adjusting the bit line voltages across the plane to modify the programming rates. In this way, the variations in programming efficacy are substantially reduced during programming of a group of memory cells coupled to the word line.

Figure 6:
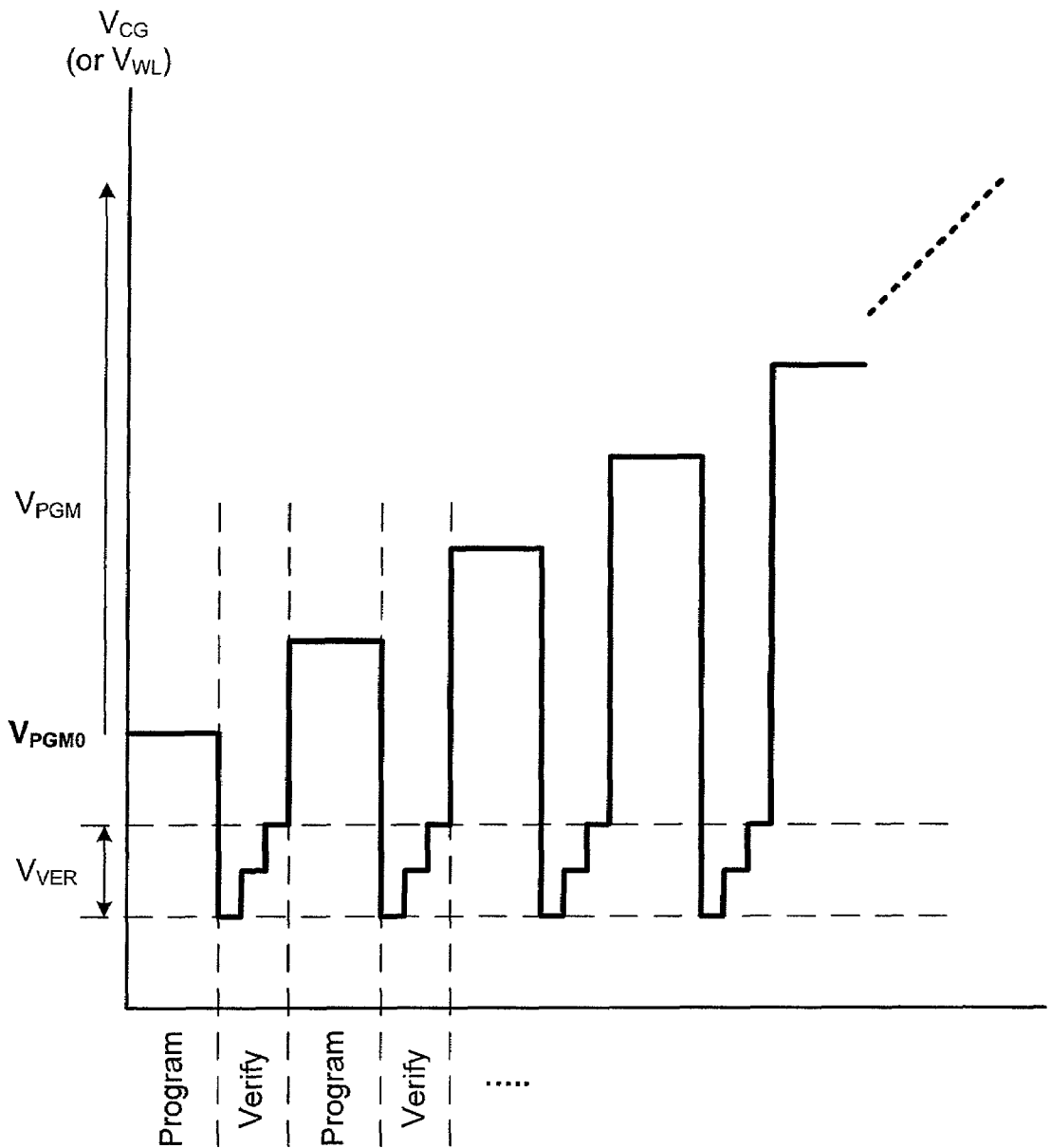
FIG. 6 illustrates a series of programming voltage pulses in the form of a staircase waveform being applied to a selected word line.
Figure 7:
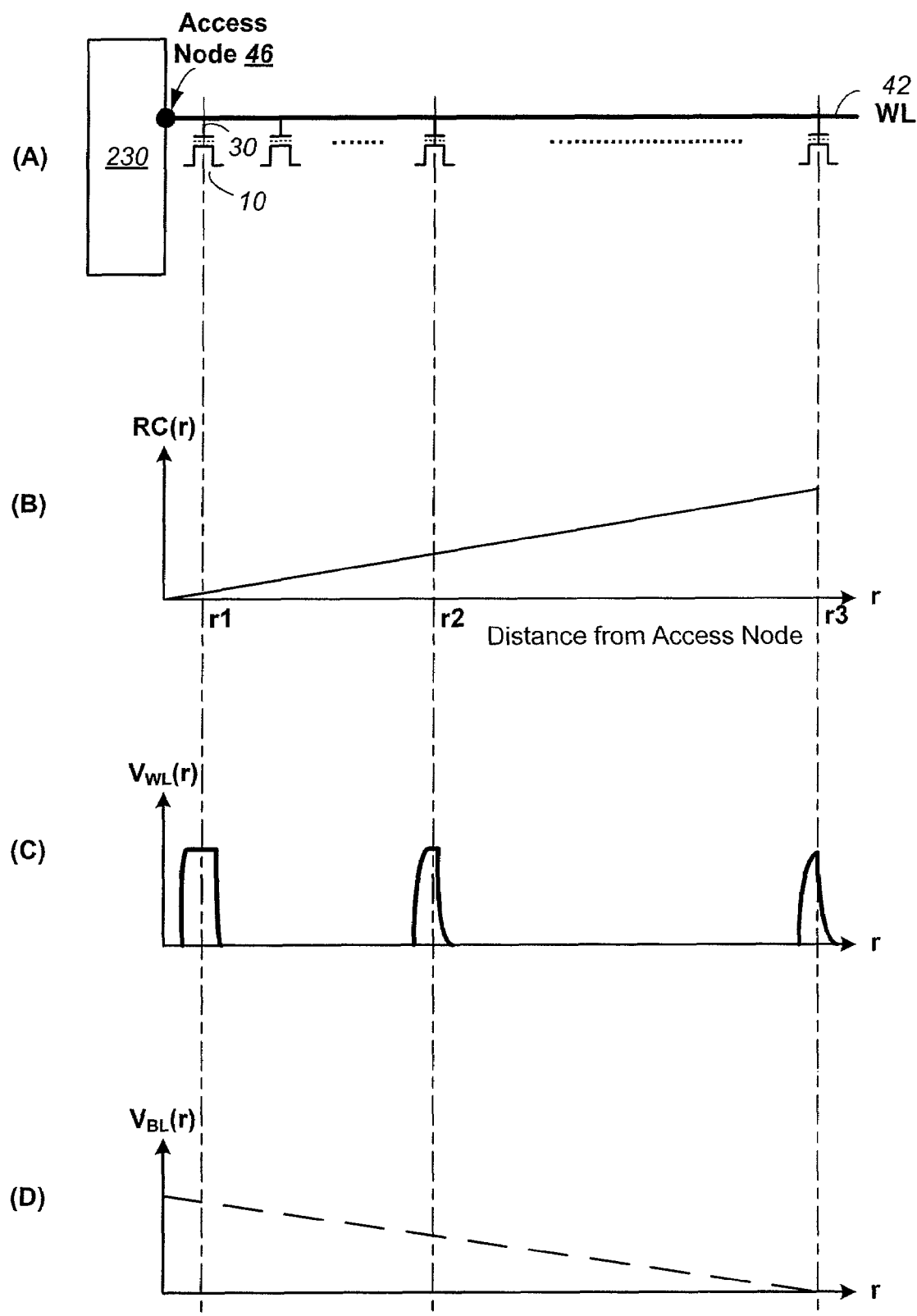
FIG. 7(A) illustrates a word line coupled to a plurality of memory cells.
FIG. 7(B) illustrates the product of resistance and capacitance of a given segment of the word line relative to the access node.
FIG. 7(C) illustrates the response of a programming pulse at various locations from the access node.
FIG. 7(D) illustrates a general scheme of the present invention to compensate for the RC variations along a word line during programming.
Figure 8:
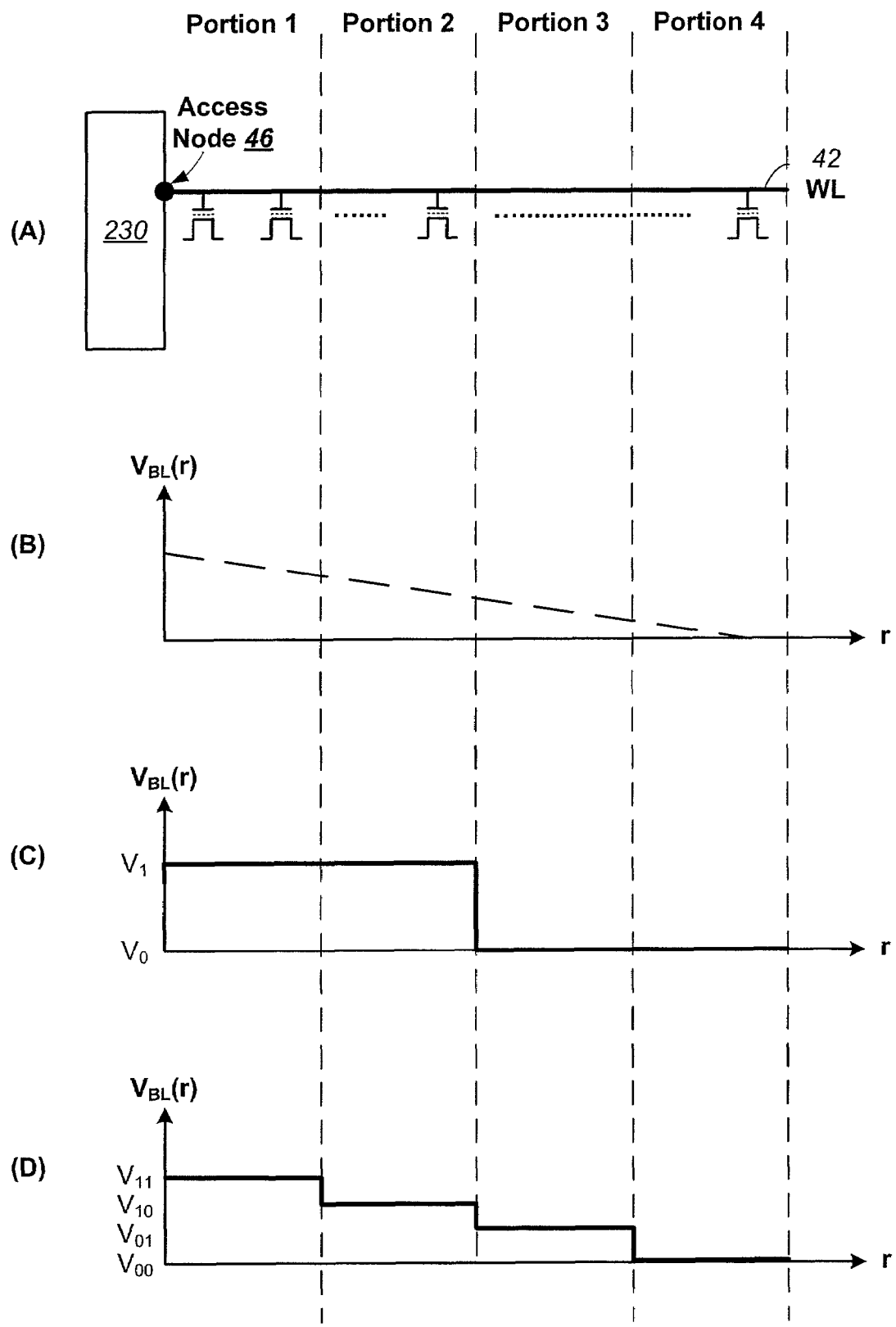
FIG. 8(A) illustrates a word line coupled to a plurality of memory cells.
FIG. 8(B) illustrates a general scheme of the present invention to compensate for the RC variations along a word line during programming.
FIG. 8(C) illustrates the bit line voltage as a function of the distance of each memory cell is from the row decoder according to a preferred embodiment.
FIG. 8(D) illustrates the bit line voltage as a function of the distance of each memory cell is from the row decoder according to another preferred embodiment.

FIG. 6 illustrates a series of programming voltage pulses in the form of a staircase waveform being applied to a selected word line. When a cell is programmed to a given state, it is subject to successive programming voltage pulses, each time attempting to add incremental charges to the floating gate. In between programming pulses, the cell is read back or verified to determine its source-drain current relative to a breakpoint level. Programming stops for a cell when it has been verified to reach the desired state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are connected to the word line can be programmed together. Whenever a memory cell of the page has been programmed to its target state, it is program-inhibited while the other cells continue to be subject to programming until all cells of the page have been program-verified.

FIGS. 7(A)-7(D) illustrate schematically the variations of various operational voltages along a word line, according to a general embodiment of the invention.

FIG. 7(A) illustrates a word line coupled to a plurality of memory cells. Depending on the type of memory architecture, each memory cell 10 may be from a NOR cell such as one shown in FIG. 4 or from a NAND string 50 such as one shown in FIG. 5A. In one embodiment, the word line WL 42 is accessible from an access node 46 at one end coupled to a word line decoder 230. During a memory operation, an operating word line voltage is supplied to the access node 46 from the word line decoder. Thus, the access node 46 can be regarded as the source of the word line voltage. A row of memory cells in a memory array shares the word line WL 42. Each memory cell 10 has its control gate 30 coupled to the WL 42 at various locations from the access node 46.

FIG. 7(B) illustrates the product of resistance and capacitance of a given segment of the word line relative to the access node. The word line WL 42 is formed from a conductor with a finite resistance. The resistance of a segment of word line is proportional to the length of the segment. On the other hand, the capacitance of a segment is substantially independent of its length. Thus, the product of RC for a segment of the word line increases linearly as a function of its length relative to the access node.

FIG. 7(C) illustrates the response of a programming pulse at various locations from the access node. When an individual programming pulse (see FIG. 6) is supplied to the assess node to the word line, it essentially encounters an RC circuit. In general, at a location r from the access node, the value of RC is given by RC(r). At that location, the voltage $V_{WL}(r)$ is a response to the input programming pulse with respect to the segment of the word line up to r. The response is a charging up of a portion of the word line with time constant given by RC(r). The charged up voltage at location r and time t is $V_{WL}(r,t)=V_{WL}(r=0)[1-EXP(-t/RC(r))]$. The discharged voltage at location r and time t is $V_{WL}(r,t)=V_{WL}(r=0)EXP(-t/RC(r))$. In other word, the product RC(r) is a time constant that determines the rate of charging or discharging of the word line at location r. After one unit of time constant, the word line will be charged to 63.2 percent. After two units of time constant, the word line will be charged to 86.5 percent, etc. Thus, the greater the RC, the slower will the charging and discharging be. For a rectangular programming pulse, the word line will be charging with the rising edge of the pulse and will be discharging with the falling edge of the pulse.

The effect of the RC variation along a word line is that for those cells further away from the row decoder, the RC delay is larger and therefore the efficacy of the programming pulse is diminished. This effect has been observed to be significant in integrated circuit chips using 56 nm technology. For example, it has been seen to cause as much as 0.4V difference in programmed VT values between cells close to the row decoder and cells far away from the row decoder (for the same number of program pulses.) This difference in programmed VT values can require additional programming pulses to reach the same VT for those cells farthest away from the row decoder.

FIG. 7(D) illustrates a general scheme of the present invention to compensate for the RC variations along a word line during programming. Essentially, the bit line voltages during programming are adjusted according to each cell's distance from the access node 46 or the row decoder 230. In general, during programming, the programming efficacy is dependent on the electric field between the control gate and the substrate or the potential difference between the control gate and the bit line. The bit line voltage during conventional programming is usually kept at a minimum with VBL=0. If the bit line voltage is higher, the programming efficacy will be reduced since the electric field to effect electrons tunneling from the substrate to the floating gate will be reduced. Since cells closer to the row decoder program faster, a higher bit line voltage is applied during their programming to slow them down compared to those further away from the row decoder. This will enable the same number of programming pulses to program all the cells along the word line to about the same VT.

FIGS. 8(A)-8(D) illustrate schematically the variations of various operational voltages along a word line, according to preferred embodiments of the invention. The word line WL is partitioned into four portions, with portion 1 closest to the access node 46 or the row decoder 230 and portion 4 furthest away. For convenience of comparison, FIG. 8(A) is the same as FIG. 7(A) and FIG. 8(B) is the same as FIG. 7(D).

FIG. 8(C) illustrates the bit line voltage as a function of the distance of each memory cell is from the row decoder according to a preferred embodiment. Essentially, to simplified wiring and circuitry, the bit line voltage across a word line is quantized into a finite number of values. FIG. 8(C) shows the plane traversed by the word line to be partitioned into two halves. The left half of the plane closest to the row decoder contains portions 1 and 2 of the word line and the right half of the plane away from the row decoder contains portions 3 and 4 of the word line. The bit line voltage $V_{BL}(r)=V_1$ for the left half of the plane and $V_{BL}(r)=V_0$ for the right half of the plane. The optimum values of $V_1$ and $V_0$ will depend on the particular memory device and can be determined by testing. In most cases, $V_0=0$.

FIG. 8(D) illustrates the bit line voltage as a function of the distance of each memory cell is from the row decoder according to another preferred embodiment. In this embodiment, the plane traversed by the word line to be partitioned into four portions corresponding to portions 1-4 of the word line. The bit line voltage $V_{BL}(r)=V_{11}, V_{10}, V_{01}$ and $V_{00}$ for portions 1, 2, 3 and 4 respectively.

Figure 9:
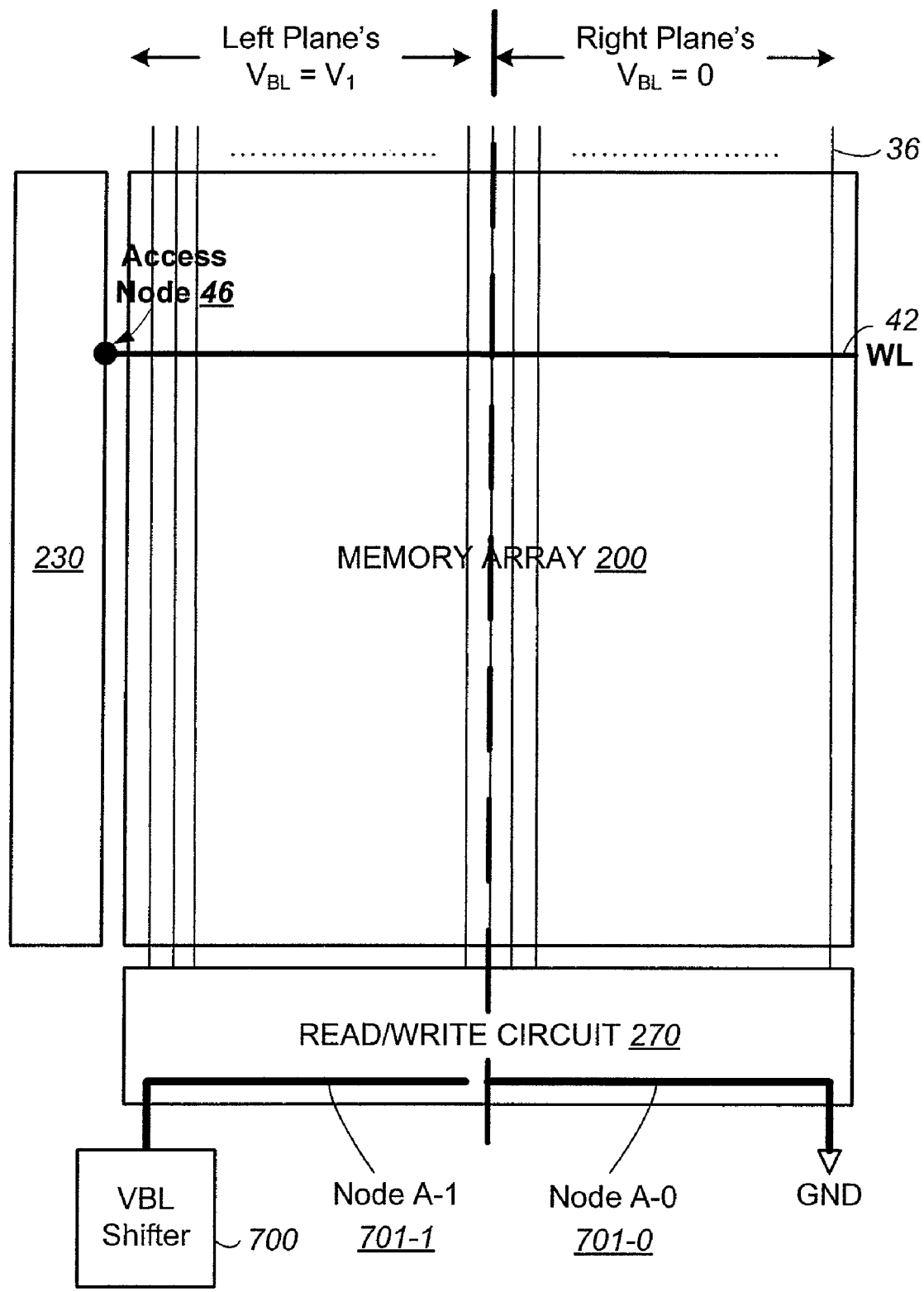
FIG. 9 illustrates one implementation of applying the bit line voltages in a memory plane according to the bit line voltage profile of FIG. 8(C).

FIG. 9 illustrates one implementation of applying the bit line voltages in a memory plane according to the bit line voltage profile of FIG. 8(C). As an example, the memory plane forms the entire memory array 200, which is spanned by word lines in the row direction and bit lines 32 in the column direction. Word line voltage is supplied to a selected word line such as WL 42 via the access node 46 of the row decoder 230. The bit lines are individually coupled to sense modules in the read/write circuit 270 (which in FIG. 1 is distributed between read/write circuits 270A and 270B.) Each sense module has a node A which can set the coupled bit line either to a ground potential or to a predetermined bit line voltage. For the binary embodiment shown in FIG. 8(C), the bit lines in the left half of the plane shown in FIG. 9 are all coupled to a Node A-1 701-1, which is set to the predetermined voltage $V_1$ using a VBL shifter 710. On the other hand, the bit lines in the right half of the plane are all coupled to a Node A-0 701-0, which is set to the predetermined voltage $V_0$ (e.g., ground potential.)

Figure 10:
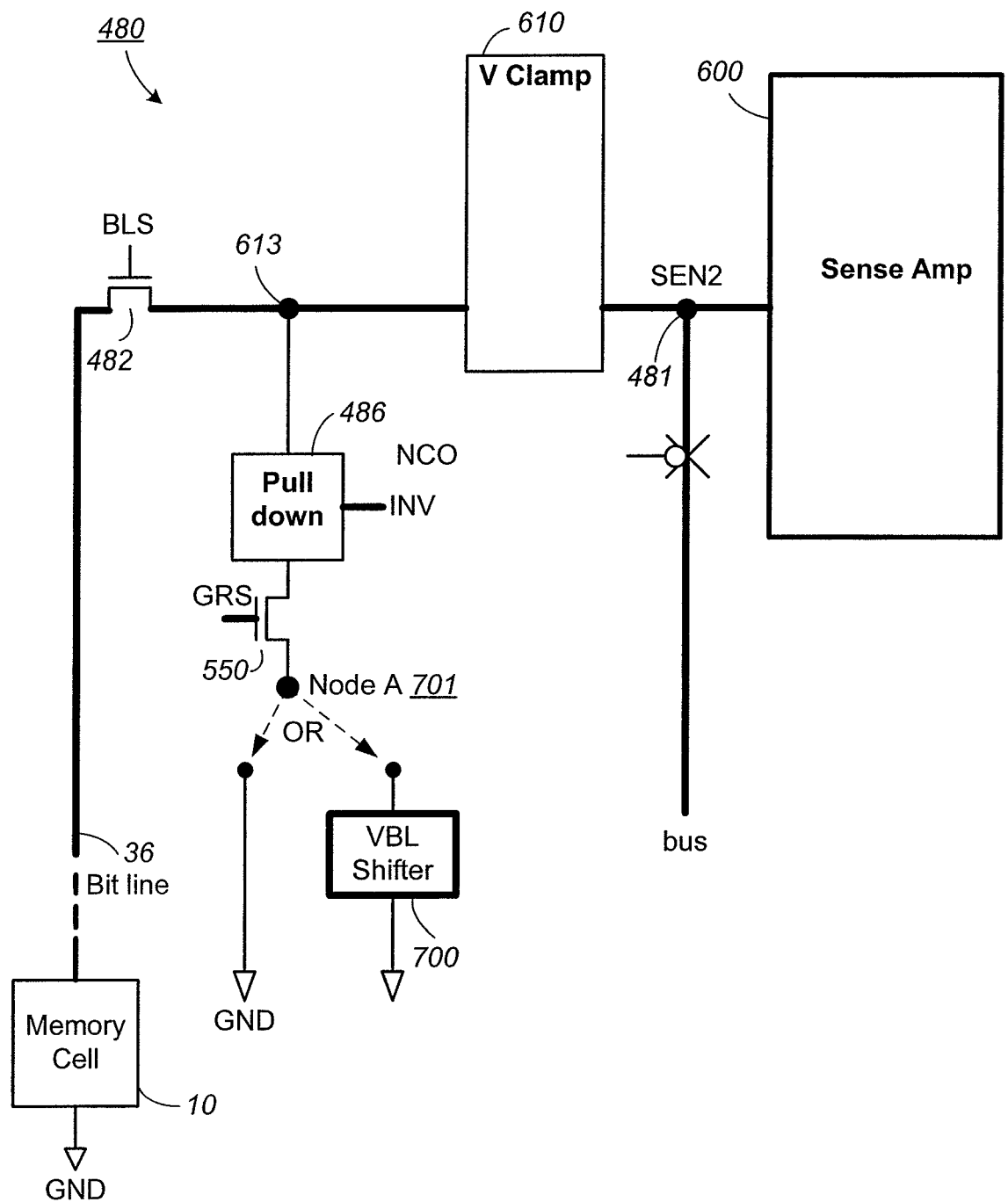
FIG. 10 illustrates a preferred sense module for setting the bit line voltage in more detail.

FIG. 10 illustrates a preferred sense module for setting the bit line voltage in more detail. The sense module 480 includes a sense amplifier 600 for sensing a current at a node SEN2 481. The sense node SEN2 can be selectively coupled to the bit line 36 and the memory cell 10 or a readout bus 499 via a voltage clamp 610 and an isolation transistor 482. However, during programming the sense amplifier 600 and the voltage clamp 610 is disabled. Essentially, the bit line voltage is set at the node Node A 701. When the isolation transistor is turned on with a signal BLS, the bit line is coupled to a node 613 which in turned is coupled to Node A 701 via a number of circuit stages such as a pull down circuit 486 (enabled by a signal INV) and a pull-down isolation transistor 550 (enabled by a signal GRS.) During programming, when the bit line voltage is to be set via Node A 701, the transistors 482, 550 and the pull-down circuit 486 are all turned on so that the bit line 36 is coupled to Node A 701.

As described in connection with FIG. 9, the Node A 701 of individual sense modules on the left half of the memory plane are coupled to a node Node A-1 701-1, which in turned is being driven to a voltage V1 by the VBL shifter 700. Similarly, the Node A 701 of individual sense modules on the right half of the memory plane are coupled to a node Node A-0 701-0, which set to a ground potential.

While the description has been given for the binary embodiment of FIG. 8(C), it is clear for the case where the plane is partitioned into multiple portions, the respective bit lines of each portions will have their Node As coupled to a predetermined voltage. The predetermined voltage is set to a ground potential for the portion furthest away from the row decoder. For other portions, the predetermined voltage is set by the respective VBL shifter.

Figure 11:
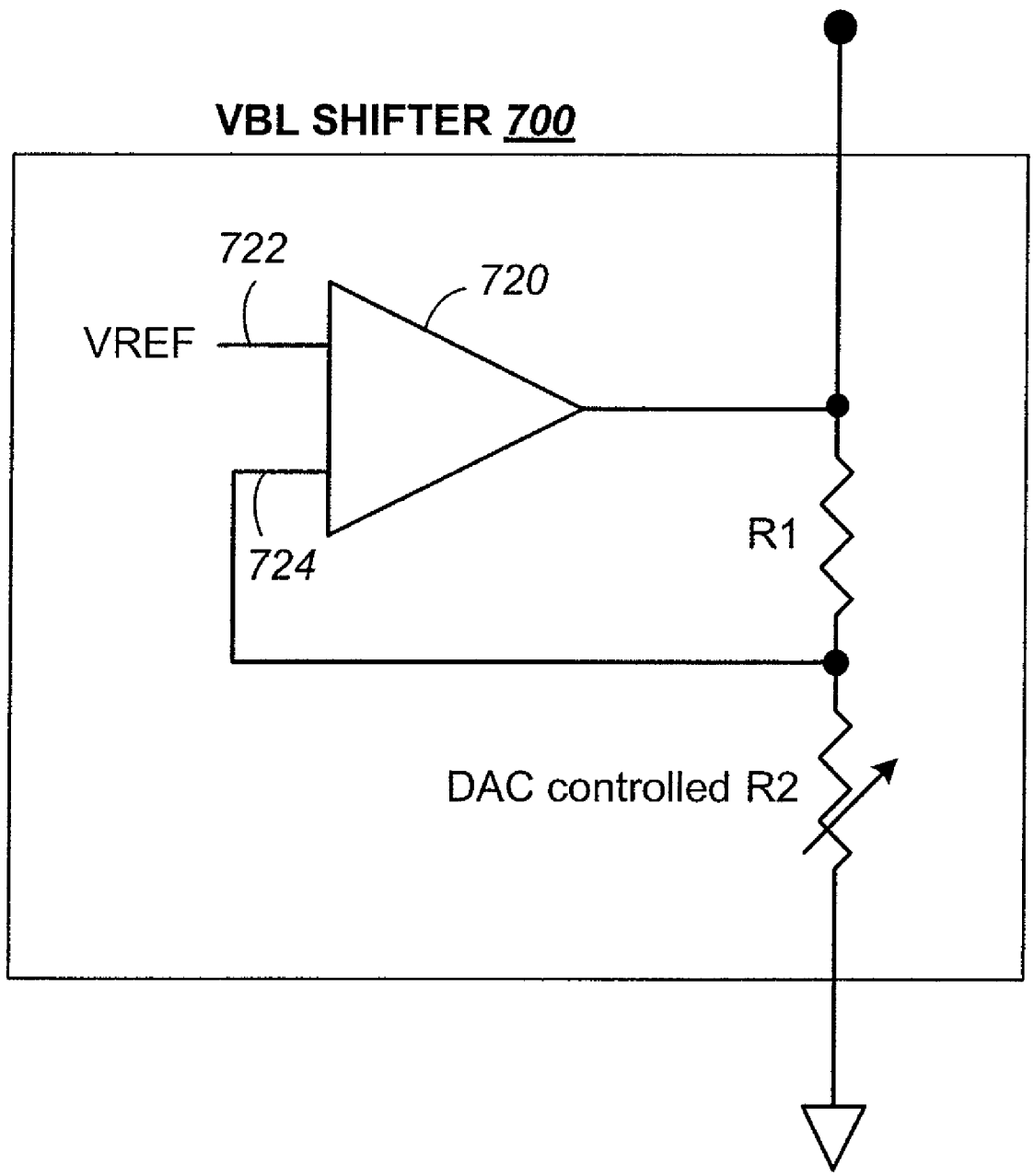
FIG. 11 illustrates one embodiment of the VBL shifter shown in FIGS. 9 and 10.

FIG. 11 illustrates one embodiment of the VBL shifter shown in FIGS. 9 and 10. The VBL shifter 700 is inserted between the Node A of individual sense modules and ground. In particular, a potential divider formed by two resistors R1 and R2 in series is inserted between Node A and ground. In one embodiment, the resistor R2 is adjustable digitally by a DAC controlled circuit. A differential amplifier 720 is used to drive Node A. The differential amplifier 720 has two differential inputs, 722 and 724. A reference voltage VREF is connected to input 722 and a voltage tapped from between R1 and R2 is connected to input 724. In this way, the voltage at Node A can be set to a desirable value by adjusting the value of R2.

Figure 12:
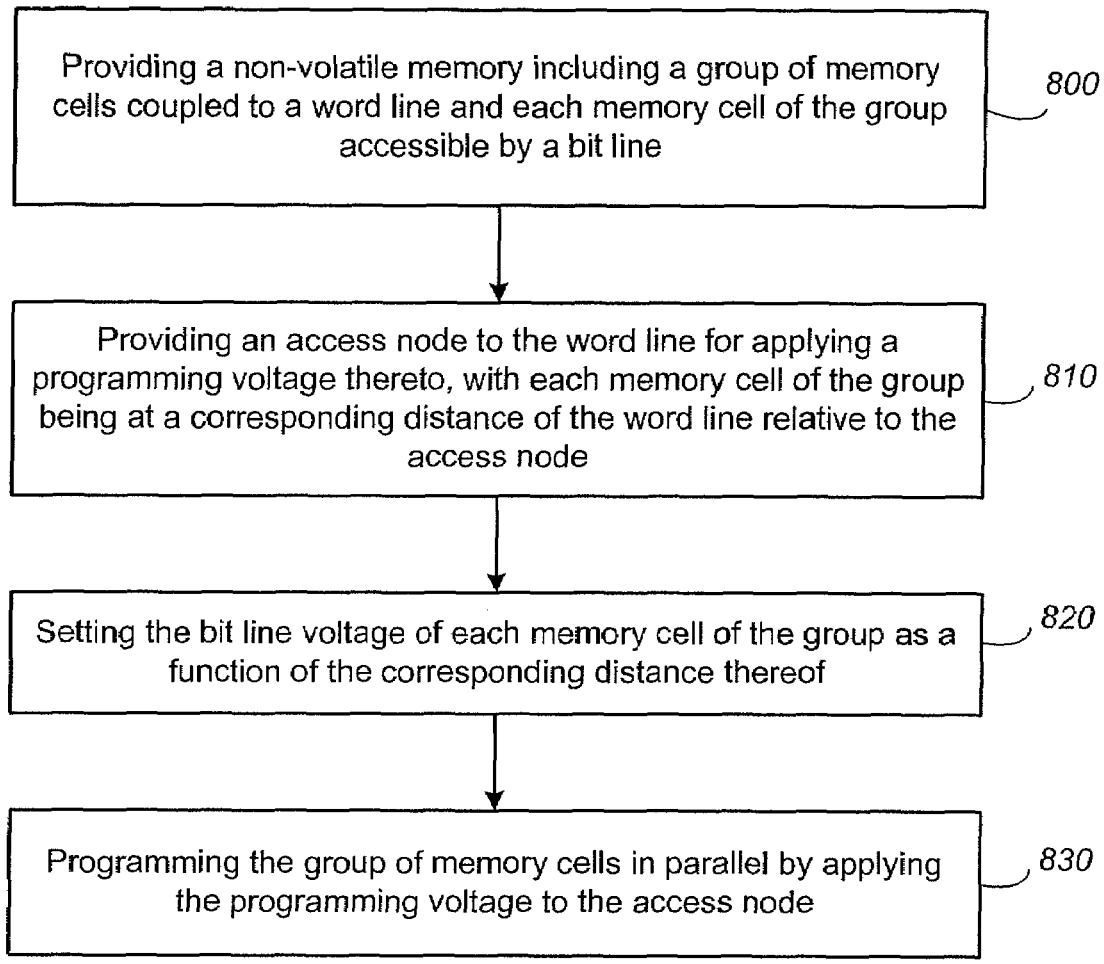
FIG. 12 is a flow diagram illustrating programming with bit-line compensation along a word line, according to a general technique of the invention.

FIG. 12 is a flow diagram illustrating programming with bit-line compensation along a word line, according to a general technique of the invention.

STEP 800: Providing a non-volatile memory including a group of memory cells coupled to a word line and each memory cell of the group accessible by a bit line.

STEP 810: Providing an access node to the word line for applying a programming voltage thereto, with each memory cell of the group being at a corresponding distance of the word line relative to the access node. For example, the access node is from the row decoder 230 (see FIG. 8(A).)

STEP 820: Setting the bit line voltage of each memory cell of the group as a function of the corresponding distance thereof. For example, the bit line voltage profiles of FIG. 8(C) or 8(D) can be applied.

STEP 830: Programming the group of memory cells in parallel by applying the programming voltage to the access node.

Quick Pass Write Implementation

In another preferred embodiment, a "Quick Pass Write" ("QPW") programming technique is also implemented. Whenever programming of a cell approaches close to a verification demarcation point, the programming will be switched to a slower (i.e. finer) mode by suitable biasing of the bit line voltage or by modifying the programming pulses. In this way, larger programming steps can be used initially for rapid convergence without the danger of overshooting the target state. "QPW" programming algorithm has been disclosed in U.S. patent application Ser. No. 11/323,596, filed Dec. 29, 2005 and entitled, "Methods for Improved Program-Verify Operations in Non-Volatile Memories," the entire disclosure of which is hereby incorporated herein by reference.

The QPW programming technique can be combined with the present compensation technique. The two techniques both make adjustment to the bit line voltage to accomplish their objectives. The QPW technique adjusts the bit line voltage at a certain time while the compensation for word line variations adjusts the bit line voltage as a function of the cell displacement from the row decoder. Thus, the two adjustments can be applied linearly without detracting from the other. For example for the bit line voltages with the binary profile as shown in FIG. 8(C), the left half of the plane may have the bit lines set to 0.35V whereas the right half remains at 0V. When QPW is implemented the initial bit line voltages is the same as FIG. 8(C). When a given cell has it programming close to the demarcation point, the bit line of the cell will have an increase of, for example, 0.7V to slow down the programming close to the demarcation point. Thus, if the cell is in the left half of the plane, its bit line voltage will be 1.05V and if the cell is in the right half of the plane, its bit line voltage will be 0.7V.

Another implementation of the present invention is to also implement QPW on the left half of the plane while not using QPW on the right half of the plane.

While examples have been presented for the bit line voltages with a binary (FIG. 8(C)) or a quaternary profile (FIG. 8(D)) across a word line during programming, other profiles are possible. In the ideal case, one would decrease the bit line voltages in an analog fashion (FIG. 8(B)) as one goes further away from the access point or the row decoder to compensate for the reduction in programming efficacy.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A non-volatile memory, comprising:
an array of memory cells in a memory plane;
a group of memory cells coupled to a word line spanning across the memory plane, each memory cell of the group accessible by a bit line in a column of the memory plane,
an access node to the word line for applying a programming voltage thereto, with each memory cell of the group being at a corresponding distance of the word line relative to the access node;
the memory plane being partitioned into a plurality of columnar portions, each portions contains a set of bit lines;
an independent voltage source for each set of bit lines for supplying a bit line voltage as a function of the corresponding distance from the access node; and
wherein the programming voltage comprises a series of voltage pulses.

2. The non-volatile memory as in claim 1, wherein the voltage pulses increase in amplitude with every pulse.

3. The non-volatile memory as in claim 1, wherein:
each memory cell of the group receives the programming voltage from the access node through a corresponding RC network defined by the corresponding distance of the word line relative to the access node.

4. The non-volatile memory as in claim 3, wherein:
the programming voltage received by each memory cell has a programming efficacy modified by finite charging and discharging time due to the corresponding RC network; and
said independent voltage source for each set of bit lines supplying a bit line voltage as a function of the corresponding distance from the access node compensates for the modified programming efficacy.

5. A non-volatile memory, comprising:
an array of memory cells in a memory plane;
a group of memory cells coupled to a word line spanning across the memory plane, each memory cell of the group accessible by a bit line in a column of the memory plane,
an access node to the word line for applying a programming voltage thereto, with each memory cell of the group being at a corresponding distance of the word line relative to the access node;
the memory plane being partitioned into a plurality of columnar portions, each portions contains a set of bit lines;
an independent voltage source for each set of bit lines for supplying a bit line voltage as a function of the corresponding distance from the access node; and
wherein the word line is divided into two halves with a first half closer to the access node and a second half further from the access node; and
the function is such that it produces a first bit line voltage for memory cells coupled to the first half and a second bit line voltage for memory cells coupled to the second half of the word line.

6. The non-volatile memory as in claim 5, wherein the second bit line voltage is at a ground potential.

7. A non-volatile memory, comprising:

an array of memory cells in a memory plane;

a group of memory cells coupled to a word line spanning across the memory plane, each memory cell of the group accessible by a bit line in a column of the memory plane, an access node to the word line for applying a programming voltage thereto, with each memory cell of the group being at a corresponding distance of the word line relative to the access node;

the memory plane being partitioned into a plurality of columnar portions, each portions contains a set of bit lines;

an independent voltage source for each set of bit lines for supplying a bit line voltage as a function of the corresponding distance from the access node; and wherein the word line is divided into multiple portions; and the function is such that it produces a distinct bit line voltage for memory cells coupled to each portion of the word line.

* * * * *